United States Patent
Yang

(10) Patent No.: US 9,082,777 B2
(45) Date of Patent: Jul. 14, 2015

(54) METHOD FOR ENCAPSULATING SEMICONDUCTOR AND STRUCTURE THEREOF

(71) Applicant: Huawei Device Co., Ltd., Shenzhen (CN)

(72) Inventor: Xiong Yang, Shanghai (CN)

(73) Assignee: HUAWEI DEVICE CO., LTD., Shenzhen (CN)

( * ) Notice: Subject to any disclaimer, the term of this patent is extended or adjusted under 35 U.S.C. 154(b) by 68 days.

(21) Appl. No.: 13/710,764

(22) Filed: Dec. 11, 2012

(65) Prior Publication Data

US 2013/0102113 A1 Apr. 25, 2013

Related U.S. Application Data

(63) Continuation of application No. PCT/CN2011/076087, filed on Jun. 22, 2011.

(51) Int. Cl.
| | |
|---|---|
| H01L 21/56 | (2006.01) |
| H01L 21/58 | (2006.01) |
| H01L 23/31 | (2006.01) |
| H01L 25/16 | (2006.01) |

(52) U.S. Cl.
CPC .............. *H01L 21/56* (2013.01); *H01L 21/565* (2013.01); *H01L 23/3121* (2013.01); *H01L 25/165* (2013.01); *H01L 2924/0002* (2013.01); *Y10T 428/239* (2015.01)

(58) Field of Classification Search
CPC ............................. H01L 23/3114; H01L 24/97
USPC ........................................ 438/108, 124, 126
See application file for complete search history.

(56) References Cited

U.S. PATENT DOCUMENTS

| | | | | |
|---|---|---|---|---|
| 5,105,259 | A | * | 4/1992 | McShane et al. ............. 257/667 |
| 6,627,997 | B1 | * | 9/2003 | Eguchi et al. ................. 257/777 |
| 6,798,049 | B1 | * | 9/2004 | Shin et al. ..................... 257/678 |

(Continued)

FOREIGN PATENT DOCUMENTS

| | | |
|---|---|---|
| CN | 1959947 | 5/2007 |
| CN | 101110406 | 1/2008 |

(Continued)

OTHER PUBLICATIONS

Extended European Search Report, dated Jul. 2, 2013, in corresponding European App. No. 11789258.8 (6 pp.).

(Continued)

*Primary Examiner* — George Fourson, III
(74) *Attorney, Agent, or Firm* — Staas & Halsey LLP

(57) ABSTRACT

Embodiments of the present invention disclose a method for encapsulating a component with plastic and its encapsulation structure, which belong to the plastic encapsulation technology field. The method includes: processing, by using the surface mounting technology, a first surface of a part to be encapsulated with plastic and/or performing die bonding on the first surface; encapsulating, with plastic, the first surface of the part to be encapsulated with plastic a second surface of the part to be encapsulated with plastic the first surface and/or performing die bonding in the second face; and encapsulating, with plastic, the second surface of the part to be encapsulated with plastic. This encapsulation structure includes a substrate, where components are fixed on an upper surface and a lower surface of the substrate, and the components on the upper surface and lower surface are all encapsulated with plastic in seal.

6 Claims, 4 Drawing Sheets

(56) References Cited

U.S. PATENT DOCUMENTS

| | | | |
|---|---|---|---|
| 7,763,963 B2 * | 7/2010 | Hong | 257/686 |
| 8,597,979 B1 * | 12/2013 | Burgyan | 438/106 |
| 2004/0178514 A1 * | 9/2004 | Lee et al. | 257/787 |
| 2005/0093144 A1 * | 5/2005 | Brandenburg et al. | 257/723 |
| 2008/0251901 A1 * | 10/2008 | Camacho et al. | 257/676 |
| 2009/0298228 A1 | 12/2009 | Sato et al. | |
| 2013/0102113 A1 * | 4/2013 | Yang | 438/118 |

FOREIGN PATENT DOCUMENTS

| | | |
|---|---|---|
| CN | 101611483 | 12/2009 |
| CN | 101719760 | 6/2010 |
| CN | 102203927 | 4/2013 |
| EP | 1198005 | 4/2002 |
| WO | WO2005/067029 | 7/2005 |
| WO | 2008/100146 | 8/2008 |

OTHER PUBLICATIONS

International Search Report issued Apr. 5, 2012 in corresponding International Patent Application No. PCT/CN2011/076087.
First Chinese Office Action issued May 25, 2012 in corresponding Chinese Patent Application No. 201180000754.1.
Second Chinese Office Action issued Nov. 21, 2012 in corresponding Chinese Patent Application No. 201180000754.1.

* cited by examiner

METHOD FOR ENCAPSULATING SEMICONDUCTOR AND STRUCTURE THEREOF

CROSS-REFERENCE TO RELATED APPLICATIONS

This application is a continuation of International Patent Application No. PCT/CN2011/076087, filed Jun. 22, 2011, which is incorporated herein by reference in its entirety.

FIELD OF THE INVENTION

The present invention relates to a plastic encapsulation technology field, and in particular, to a method for encapsulating a component with plastic and a structure thereof.

BACKGROUND OF THE INVENTION

Currently, the plastic encapsulation technique is widely used in the IC (Integrated Circuit, integrated circuit) industry to enclose and solidate a semiconductor in an epoxy resin material, thereby meeting the requirement for reliability and other protection requirements.

The prior art uses a one-step molding method: fix a component on a first surface and a second surface of a substrate to form a part to be encapsulated with plastic; place the part to be encapsulated with plastic in a mould cavity of a lower mold; hold the second surface of the part to be encapsulated with plastic with supports; combine the upper and lower molds; fill the first surface with resin through the glue injection hole on the upper mold; after resin filling is complete, solidate and mold the first surface at one time to complete plastic injection on the first surface of the part to be encapsulated with plastic.

During implementation of the present invention, the inventor finds at least the following problem in the prior art: The substrate is bent at certain parts due to gravity of the substrate and component or distortion of the substrate. Therefore, during plastic injection on the first surface, the second surface of the part to be encapsulated with plastic needs to reserve a large room for support to help support the mold and prevent local bending or distortion of the substrate. The large room for support occupies a layout space on the component. Nevertheless, The space of the support plane is insufficient, and the substrate still suffers inevitable distortion possibility. To further prevent distortion, the substrate needs to be properly thickened.

SUMMARY OF THE INVENTION

The purpose of the embodiments of the present invention is to provide a method that is able to solve the problem of warpage on the part to be encapsulated with plastic according to the problem in the prior art.

Another purpose of the embodiments of the present invention is to provide an encapsulation structure for encapsulating a component with plastic.

To achieve the preceding purposes, the present invention adopts the following technical solutions: a method for encapsulating a component with plastic, including:

processing, by using the surface mounting technology, a first surface of a part to be encapsulated with plastic and/or performing die bonding;

encapsulating, with plastic, the first surface of the part to be encapsulated with plastic which has undergone the processing performed by using the surface mounting technology and/or has undergone the die bonding;

processing, by using the surface mounting technology, a second surface of the part to be encapsulated with plastic the first surface of which has undergone the encapsulating with plastic and/or performing die bonding; and encapsulating, with plastic, the second surface of the part to be encapsulated with plastic which has undergone the processing performed by using the surface mounting technology and/or has undergone the die bonding.

Another technical solution provided in an embodiment of the present invention is: an encapsulation structure for encapsulating a component with plastic, including a substrate, where components are fixed on an upper surface and a lower surface of the substrate, and the components on the upper surface and lower surface are all encapsulated with plastic in seal.

The method for encapsulating a component with plastic provided in an embodiment of the present invention, where the component that does not assemble the second surface during plastic encapsulation of the first surface uses the entire second surface as a support plane without the need of separate supports, thereby solves the problem of warpage and distortion of the substrate; as warpage factors do not need to be considered, the overall thickness of the substrate is able to be reduced, and components encapsulated with plastic are able to be deployed on both surfaces, thereby increasing the component layout density.

BRIEF DESCRIPTION OF THE DRAWINGS

To make the technical solution of the present invention clearer, the accompanying drawings for illustrating the embodiments of the present invention or the prior art are briefly described below. Apparently, the accompanying drawings are for the exemplary purpose only, and those skilled in the art are able to derive other drawings from such accompanying drawings without any creative effort.

In the figures: 1 indicates component, 2 substrate, 3 mold, 3.1 upper mold, 3.2 lowermold, 4 glue injection hole, 5 seal, 6 vacuum suction hole.

DETAILED DESCRIPTION OF THE EMBODIMENTS

To clarify the purpose, technical scheme, and advantages of the embodiments of the present invention, the following describes the embodiments of the present invention with drawings.

Embodiment 1

Figure 1:
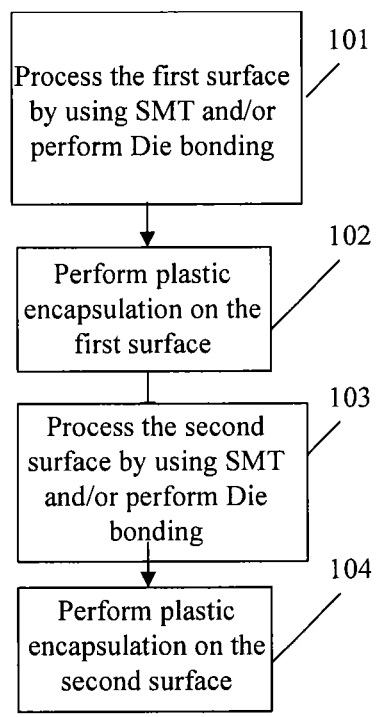
FIG. 1 is a flowchart of a technique according to an embodiment of the present invention.

As shown in FIG. 1, a method for encapsulating a component with plastic includes the following steps:

Step 101: Process, by using the SMT (Surface-mount Technology, surface mounting technology), a first surface and/or performing Die bonding (die bonding) on the first surface: Process, by using the surface mounting technology, the first surface of a part to be encapsulated with plastic and/or performing die bonding on the first surface.

Step 102: Encapsulate the first surface with plastic: Encapsulate, with plastic, the first surface of the part to be encapsulated with plastic which has undergone the processing performed by using the surface mounting technology and/or has undergone the die bonding.

Step 103: Process a second surface by using the SMT and/or performing Die bonding (die bonding) on the second surface: Process, by using the SMT, the second surface of the part to be encapsulated with plastic the first surface of which has undergone the encapsulating with plastic and/or perform Die bonding on the second surface.

Step 104: Encapsulate the second surface with plastic: Encapsulate, with plastic, the second surface of the part to be encapsulated with plastic which has undergone the processing performed by using the surface mounting technology and/or has undergone the die bonding.

In the method for encapsulating a component with plastic provided in an embodiment of the present invention, the component that does not assemble the second surface during plastic encapsulation of the first surface uses the entire second surface as a support plane without the need of separate supports, solves the problem of warpage and distortion of the substrate. By using the method according to this embodiment, as warpage factors do not need to be considered, the overall thickness of the substrate is able to be reduced, and components encapsulated with plastic are able to be deployed on both surfaces, thereby increasing the component layout density.

Embodiment 2

Figure 2:
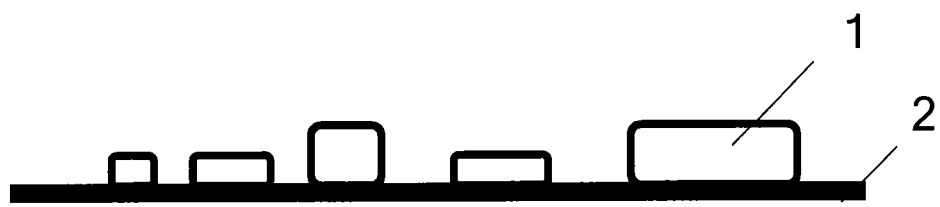
FIG. 2 is a structural schematic diagram of an upper fixing component on a single-surface substrate according to an embodiment of the present invention.

As shown in FIG. 1, a method for encapsulating a component with plastic includes the following steps:

Step 101: As shown in FIG. 2, process a first surface by using the SMT: Complete work procedures for a single surface, such as solder paste printing, pasting, and reflow, so that a component 1 is fixed on the front surface of a substrate 2; or perform Die bonding.

Figure 3:
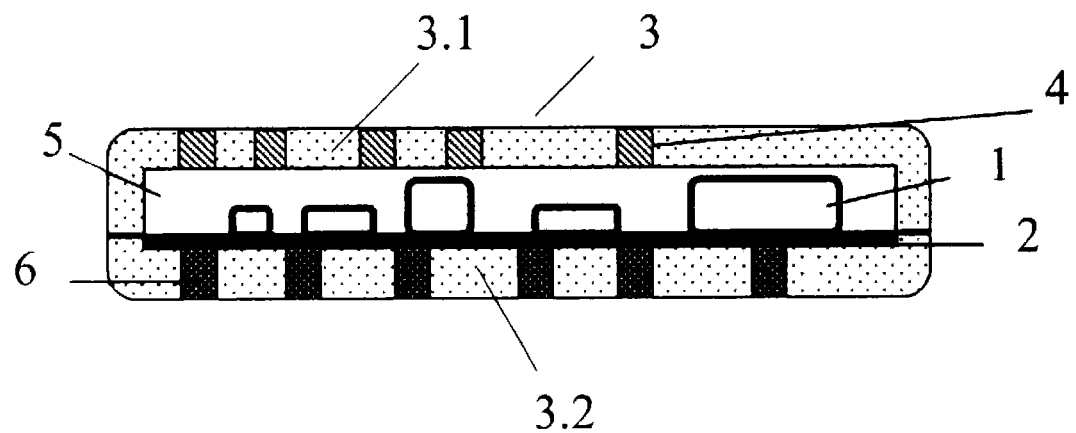
FIG. 3 is a structural schematic diagram of performing plastic encapsulation on a single-surface substrate according to an embodiment of the present invention.

Step 102: As shown in FIG. 3, encapsulate the first surface with plastic: Place a part to be encapsulated with plastic the first surface of which is processed in a mould cavity of a mold 3; combine an upper mold 3.1 and a lower mold 3.2; vacuum the bottom of the substrate 2 through a vacuum suction hole 6 at the bottom of the lower mold 3.2; inject glue through a glue injection hole 4; perform solidation so that the component 1 on the substrate 2 is encapsulated with plastic by using a seal 5.

Figure 4:
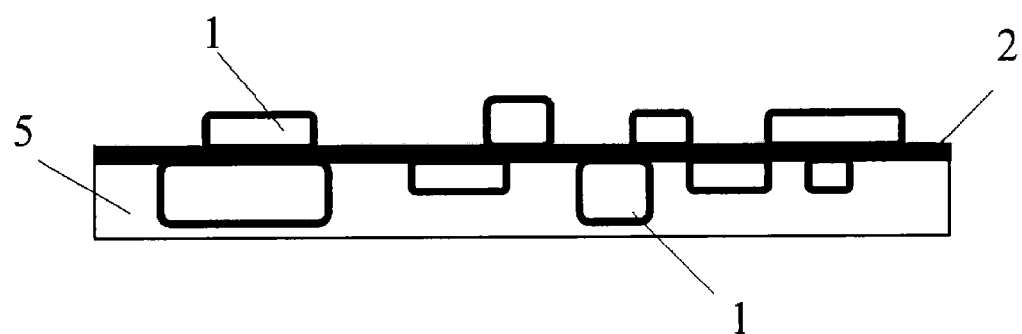
FIG. 4 is a structural schematic diagram after single-surface encapsulation according to an embodiment of the present invention.

Step 103: As shown in FIG. 4, process a second surface with SMT: Complete work procedures for a second surface, such as solder paste printing, pasting, and reflow, so that the component 1 is fixed on the back surface of the substrate 2; or perform Die bonding.

Figure 5:
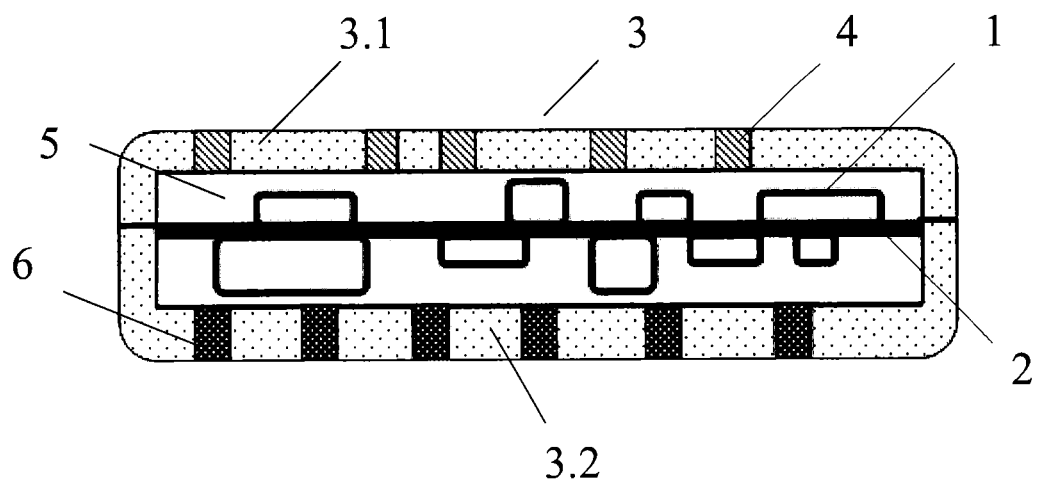
FIG. 5 is a structural schematic diagram for dual-surface encapsulation according to an embodiment of the present invention.

Step 104: As shown in FIG. 5, encapsulate the second surface with plastic: Place the part to be encapsulated with plastic the second surface of which is processed in the mould cavity of mold 3; place the second surface of the part to be encapsulated with plastic under the glue injection hole 4; combine the upper mold 3.1 and the lower mold 3.2; vacuum the bottom of the first surface that is encapsulated with plastic through the vacuum suction hole 6 at the bottom of the lower mold 3.2 to keep a smooth plane; after injecting glue through the glue injection hole 4, perform solidation so that the component 1 on the front and back surfaces of the substrate 2 is encapsulated with plastic by using the seal 5.

In the method for encapsulating a component with plastic provided in an embodiment of the present invention, the entire second surface is used as the support plane during plastic encapsulation of the first surface without the need of separate supports, thereby solves the problem of warpage and distortion of the substrate; as warpage factors do not need to be considered, the overall thickness of the substrate is able to be reduced, and components encapsulated with plastic are able to be deployed on both surfaces, thereby increasing the component layout density; compared with the one-step molding mode, the use of plastic encapsulation molds requires no support and a lower cost. Dual-surface plastic encapsulation technique may be directly used to replace a plastic or metal shell of a traditional product (other electronic products such as mobile phone).

Embodiment 3

Figure 7:
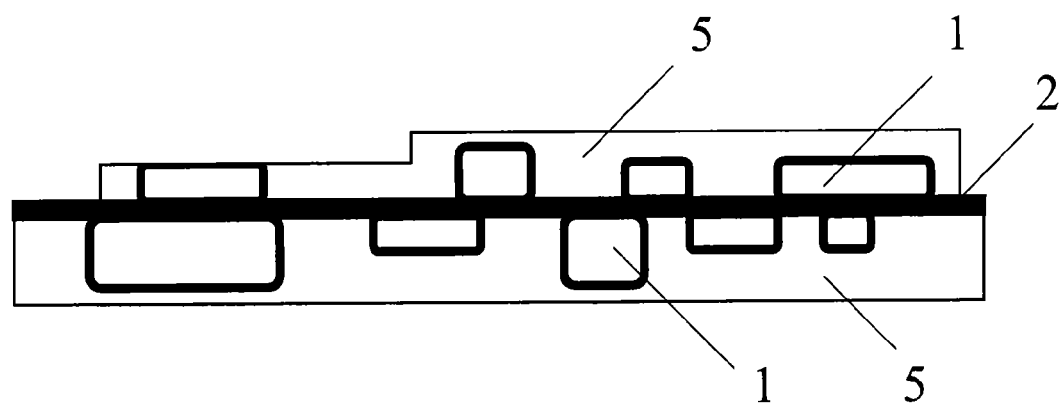
FIG. 7 is a structural schematic diagram after plastic encapsulation by using dispensing for plastic encapsulation of the second surface according to an embodiment of the present invention.

As shown in FIG. 7, this embodiment is based on Embodiment 2, and changes the manner by using which a second surface is encapsulated with plastic into a dispensing manner in which molds are not used to inject plastic. Mould opening is not required in the operation, which has the advantage of easy operation.

Figure 6:
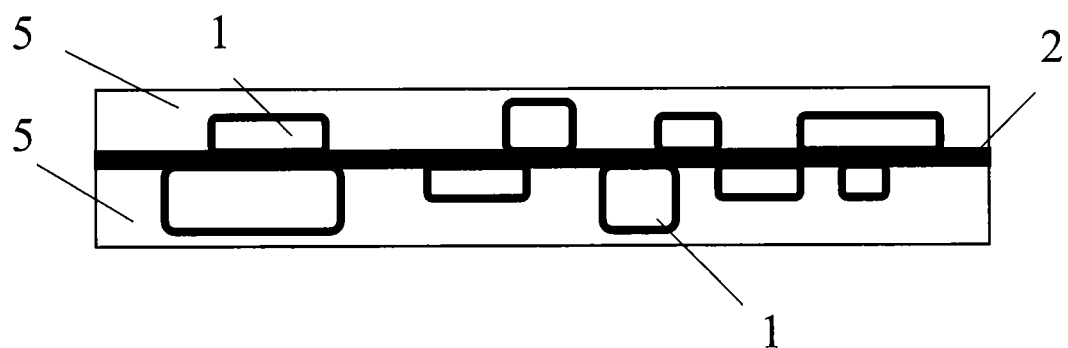
FIG. 6 is a structural schematic diagram after dual-surface encapsulation according to an embodiment of the present invention.

FIG. 6 shows an encapsulation structure for encapsulating a component with plastic, including a substrate 2, where components 1 are fixed on both an upper surface and a lower surface of the substrate 2, and the components 1 on the upper surface and lower surface are both encapsulated with plastic in a seal 5.

The dual-surface plastic encapsulation of the component in this embodiment endows both surfaces with characteristics such as dustproof and waterproof, and good internal sealability.

Figure 8:
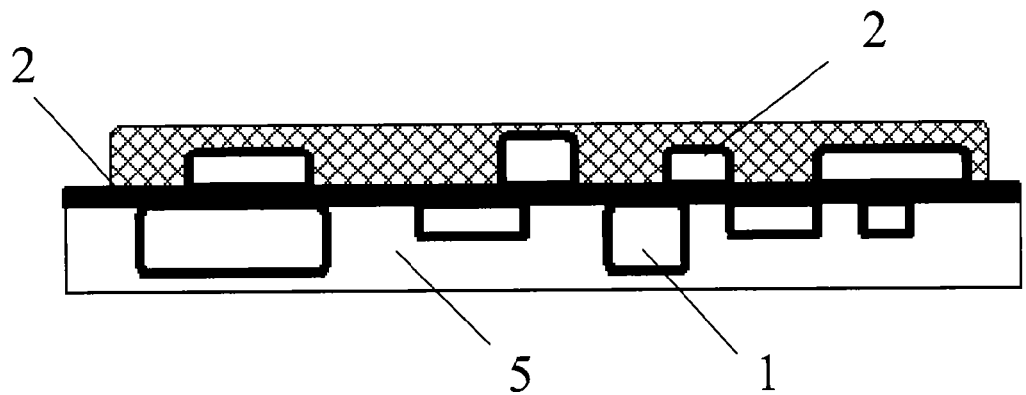
FIG. 8 is a structural schematic diagram where a surface of seal is in a step-like form according to an embodiment of the present invention.

As shown in FIG. 8, the upper surface and/or lower surface of the seal 5 are in a step-like form. Preferably, one surface of the seal 5 is in the step-like form.

When the first surface of the seal is in the step-like form, during sealing for the second surface, a surface of an internal cavity of the lower mould may also be made into a step-like form corresponding to the first surface, thereby helping vacuum the lower surface of the first surface to keep a smooth plane.

The component in this embodiment may be an active/passive component such as a resistor, a capacitor, and/or a raw wafer.

The seal in this embodiment is epoxy resin.

The preceding embodiments are intended to illustrate but not to confine the present invention. The invention is intended to cover all the modifications, equivalent replacements, and improvements without departing from the spirit and principles of the invention.

What is claimed is:

1. A method for encapsulating a component of a surface of a part with plastic, comprising:
- processing, by using surface mounting technology, a first surface of the part to be encapsulated with plastic and/or performing die bonding on the first surface;
- encapsulating, with plastic, the first surface of the part to be encapsulated with plastic which has undergone the processing performed by using the surface mounting technology and/or has undergone the die bonding;
- processing, by using the surface mounting technology, a second surface of the part to be encapsulated with plastic and/or performing die bonding on the second surface, the first surface of which has undergone the encapsulating with plastic; and
- encapsulating, with plastic, the second surface of the part to be encapsulated with plastic which has undergone the processing performed by using the surface mounting technology and/or has undergone the die bonding,
- wherein the encapsulating the first surface with plastic comprises injecting glue to encapsulate the first surface with plastic and before the injecting of the glue:
  - placing the part to be encapsulated with plastic in a mold cavity of a lower mold;
  - combining the lower mold and an upper mold; and
  - vacuuming the second surface through a vacuum suction hole at the bottom of the lower mold to keep plane of the second surface smooth.

2. The method for encapsulating a component of a surface of a part with plastic according to claim 1, wherein the injecting of the glue comprises:
- injecting the glue to the first surface through a glue injection hole on the upper mold and solidating the first surface.

3. The method for encapsulating a component of a surface of a part with plastic according to claim 1, wherein the encapsulating the second surface with plastic comprises:
- placing the part to be encapsulated with plastic in the mold cavity of the lower mold, wherein the second surface of the part is processed by using the surface mounting technology and/or die bonding is performed on the second surface, placing the second surface of the part to be encapsulated with plastic under a glue injection hole on the upper mold, and combining the upper mold and the lower mold;
- vacuuming the bottom of the first surface plastic that is encapsulated with plastic through the vacuum suction hole at the bottom of the lower mold to keep the plane of the bottom of the first surface plastic that is encapsulated with plastic smooth; and
- injecting glue to the second surface through the glue injection hole on the upper mold and solidating the second surface.

4. The method for encapsulating a component of a surface of a part with plastic according to claim 2, wherein the encapsulating the second surface with plastic comprises: using a dispensing manner for encapsulating the second surface with plastic.

5. The method for encapsulating a component of a surface of a part with plastic according to claim 2, wherein the encapsulating the second surface with plastic comprises:
- placing the part to be encapsulated with plastic in the mold cavity of the lower mold, wherein the second surface of the part is processed by using the surface mounting technology and/or die bonding is performed on the second surface, placing the second surface of the part to be encapsulated with plastic under the glue injection hole on the upper mold, and combining the upper mold and the lower mold;
- vacuuming the bottom of the first surface plastic that is encapsulated with plastic through the vacuum suction hole at the bottom of the lower mold to keep the plane of the bottom of the first surface plastic that is encapsulated with plastic smooth; and
- injecting glue to the second surface through the glue injection hole on the upper mold and solidating the second surface.

6. The method for encapsulating a component of a surface of a part with plastic according to claim 1, wherein the first surface and/or second surface encapsulated with the plastic are in a step-like form.

* * * * *